(12) United States Patent
Araya

(10) Patent No.: US 8,111,455 B2
(45) Date of Patent: Feb. 7, 2012

(54) LIGHT SOURCE APPARATUS AND LASER SCANNING MICROSCOPE

(75) Inventor: Akinori Araya, Yokohama (JP)

(73) Assignee: Olympus Corporation, Tokyo (JP)

( * ) Notice: Subject to any disclaimer, the term of this patent is extended or adjusted under 35 U.S.C. 154(b) by 321 days.

(21) Appl. No.: 12/272,923

(22) Filed: Nov. 18, 2008

(65) Prior Publication Data

US 2009/0135476 A1     May 28, 2009

(30) Foreign Application Priority Data

Nov. 26, 2007   (JP) ................. 2007-304896
Oct. 15, 2008   (JP) ................. 2008-266551

(51) Int. Cl.
  G02B 21/06     (2006.01)
  G02B 21/00     (2006.01)
(52) U.S. Cl. .............. 359/388; 359/385; 359/368
(58) Field of Classification Search ........... 359/368–390
   See application file for complete search history.

(56) References Cited

U.S. PATENT DOCUMENTS

| | | | |
|---|---|---|---|
| 5,579,328 A | 11/1996 | Habel et al. | |
| 7,253,950 B2 * | 8/2007 | Araya | 359/388 |
| 2004/0061073 A1 | 4/2004 | Kitagawa | |
| 2006/0203241 A1 | 9/2006 | Schreiber | |
| 2007/0098415 A1 | 5/2007 | Lupo et al. | |
| 2007/0153367 A1 | 7/2007 | Kawasaki | |
| 2009/0274182 A1 * | 11/2009 | Morikawa et al. | 372/29.015 |

FOREIGN PATENT DOCUMENTS

| | | | |
|---|---|---|---|
| DE | 103 59 374 A1 | | 7/2005 |
| EP | 1 688 774 A1 | | 8/2006 |
| JP | 2777268 B2 | | 5/1998 |
| JP | 10-178229 A | | 6/1998 |
| JP | 2009-152545 | * | 7/2009 |
| WO | WO 2004/097491 A | | 11/2004 |
| WO | WO 2007/007733 A | | 1/2007 |

OTHER PUBLICATIONS

English language Extended European Search Report (8 pages), issued in counterpart European Application Application Serial No. 08020235.1, Mar. 24, 2009.

* cited by examiner

*Primary Examiner* — Thong Nguyen
(74) *Attorney, Agent, or Firm* — Holtz, Holtz, Goodman & Chick, PC

(57) ABSTRACT

A light source apparatus is provided which includes semiconductor laser elements that emit laser light according to an inputted current signal, a light receiving element that receives the laser light emitted from the semiconductor laser elements, and a controller that controls light emission of the semiconductor laser elements. The controller includes a first semiconductor laser element drive circuit that outputs a current signal to the semiconductor laser elements according to an instruction signal, a second semiconductor laser element drive circuit that adjusts the current signal based on a light quantity of the laser light received by the light receiving element, and outputs the adjusted current signal to the semiconductor laser elements, and a circuit switching section that switches between the first and the second semiconductor laser element drive circuits according to an instruction signal.

14 Claims, 10 Drawing Sheets

LIGHT SOURCE APPARATUS AND LASER SCANNING MICROSCOPE

BACKGROUND OF THE INVENTION

1. Field of the Invention

The present invention relates to a light source apparatus and a laser scanning microscope.

This application is based on Japanese Patent Applications, Nos. 2007-304896 and 2008-266551, the content of which is incorporated herein by reference.

2. Description of Related Art

A light source apparatus has been known in the past, which includes a laser diode generating repetitive pulse light (for example, refer to a specification of the Publication of Japanese Patent NO. 2777268).

The light source apparatus includes a lock-in amplifier, and is intended to provide a high speed pulse with low noise by providing a peak in frequency of a reference signal for the lock-in amplifier.

However, when the lock-in amplifier is in use, the reference signal needs to have a frequency, and therefore when light having certain light quantity is continuously emitted, there is a problem in that the quantity of light cannot be stabilized. Moreover, when the lock-in amplifier is in use, there is a problem in that a light source apparatus becomes expensive.

On the other hand, in some method, feedback of light is made using a detector such as photodiode in order to stabilize the quantity of light. However, when light modulated at high frequency is detected and fed back, there is a problem in that response speed of a feedback circuit cannot follow modulation speed of the light due to floating capacitance or high feedback gain of the feedback circuit.

Therefore, when both of highly stable light and fast-modulated light are emitted, even if light having the same wavelength are emitted, separate laser diodes are required.

When a laser diode is in use at a low power, a photodiode incorporated in the laser diode may be reduced in response speed (much time may be taken before the photodiode is stabilized) in some photodiode type. Therefore, when a feedback circuit is configured, there is a problem in that actual output value overshoots a target output value given by a lighting instruction signal.

Therefore, even when laser light is modulated at low frequency, when feedback of light is made using a detector-such as photodiode, stability of the light may be reduced in some lighting power.

BRIEF SUMMARY OF THE INVENTION

The present invention provides a light source apparatus and a laser scanning microscope, which can simply and inexpensively emit both of highly stable light having the same optical performance and fast-modulated light.

A first aspect of the present invention provides a light source apparatus includes a light source apparatus having laser diode elements that emit laser light according to an inputted current signal; a light receiving element that receives the laser light emitted from the laser diode element; and a controller that controls light emission of the laser diode element, wherein the controller includes, a first laser diode drive circuit that outputs a current signal to the laser diode elements according to an instruction signal; a second laser diode drive circuit that adjusts the current signal on the basis of on the light quantity of the laser light received by the light receiving element, and outputs the adjusted current signal to the laser diode element; and a circuit switching section that switches between the first laser diode drive circuit and the second laser diode drive circuit according to an instruction signal.

According to the first aspect of the present invention, when fast-modulated laser light is required, the controller actuates the circuit switching section to select the first laser diode drive circuit, so that the current signal is outputted to the laser diode elements according to the instruction signal. Thus, fast-modulated laser light according to a high-speed instruction signal can be emitted from the laser diode element. On the other hand, when highly stable laser light is required, the controller actuates the circuit switching section to select the second laser diode drive circuit, so that emitted laser light is received by the light receiving element, and consequently a current signal fed back with the light quantity of the received laser light can be inputted into the laser diode element. Thus, highly stable laser light can be emitted from the laser diode element.

That is, according to the present invention, both of fast-modulated laser light and highly stable laser light can be emitted from the same laser diode elements with simply configuration and at a low cost.

A second aspect of the present invention is a light source apparatus of the first aspect, wherein the first laser diode drive circuit outputs a current signal to allow the laser diode elements to emit pulsed laser light, and the second laser diode drive circuit is used when a current signal is outputted to allow the laser diode elements to emit continuous laser light.

By configuring in this way, fast-modulated pulsed laser light and continuous laser light can be emitted from the same laser diode element.

In the second aspect, the light source apparatus may include a current detection section that detects a current signal value to be outputted to the laser diode elements when the second laser diode drive circuit is selected; a storage section that stores the current signal value detected by the current detection section and the light quantity of laser light detected by the light receiving element while relating the signal value and the light quantity to each other; and an instruction signal correction section that corrects an instruction signal to be inputted into the first laser diode drive circuit on the basis of the current signal value and the light quantity stored in the storage section when the first laser diode drive circuit is selected.

By configuring in this way, when the second laser diode drive circuit is selected, and the light quantity of laser light detected by the light receiving element is fed back so that highly stable laser light is emitted, the current detection section defects the current signal value to be outputted to the laser diode element, thereby even if the laser diode elements are degraded, and thereby a current signal value corresponding to the same instruction signal increases, laser light having the stable light quantity can be emitted from the laser diode elements when the first laser diode drive circuit is selected.

A third aspect of the present invention is a light source apparatus of the first aspect, in which the first laser diode drive circuit is used when output power of the laser diode elements is low, and the second laser diode drive circuit is used when output power of the laser diode elements is high.

By configuring in this way, stable light can be obtained while eliminating influence of a response characteristic, being reduced in low output power, of a photodiode incorporated in each laser diode, and consequently a sample can be observed more accurately.

In the third aspect, the light source apparatus may include a current detection section that detects a current signal value to be outputted to the laser diode elements when the second laser diode drive circuit is selected; a storage section that stores the current signal value detected by the current detection section and the light quantity of laser light detected by the light receiving element while relating the signal value and the light quantity to each other; and an instruction signal correction section that corrects an instruction signal to be inputted into the first laser diode drive circuit on the basis of the current signal value and the light quantity stored in the storage section when the first laser diode drive circuit is selected.

By configuring in this way, when the second laser diode drive circuit is selected, and the light quantity of laser light detected by the light receiving element is fed back so that highly stable laser light is emitted, the current detection section detects the current signal value to be outputted to the laser diode element, thereby even if output of the laser diode elements is reduced, and thereby a current signal value corresponding to the same instruction signal increases, laser light having the stable light quantity can be emitted from the laser diode elements when the first laser diode drive circuit is selected.

A fourth aspect of the present invention is a laser scanning microscope including the light source apparatus of one of the first to third aspects, a scan section that two-dimensionally scans laser light emitted from the light source apparatus; an objective lens that irradiates the laser light scanned by one scan section to a sample, and collects returning light returning from the sample; and a light detection section that detects the returning light being collected by the objective lens, and returning via the scan section.

According to the fourth aspect of the present invention, the laser light emitted from the light source apparatus is two-dimensionally scanned by the scan section, and irradiated to the sample by the objective lens, thereby returning light from the sample is collected by the objective lens, and detected by the light detection section. The light source apparatus may emit highly stable laser light and fast-modulated laser light while switching between them, and thus may observe a sample while irradiating laser light having the same optical characteristics such as the same wavelength, the same beam diameter, or the same beam divergence angle.

A fifth aspect of the present invention is a laser scanning microscope including the light source apparatus of the second aspect, a scan section that two-dimensionally scans laser light emitted from the light source apparatus; an objective lens that irradiates the laser light scanned by the scan section to a sample, and collects returning light returning from the sample; a light detector that detects the returning light being collected by the objective lens, and returning via the scan section; and a timing switching section that switches detection timing of the light detector depending on frequency of pulsed laser light to be emitted when the circuit switching section switches a circuit to the first laser diode drive circuit.

According to the fifth aspect of the present invention, when the circuit switching section of the light source apparatus selects the first laser diode drive circuit, pulsed laser light is emitted from the light source, and the timing switching section operates to switch detection timing of the light detector depending on frequency of the pulsed laser light. Thus, the pulsed laser light emitted from the light source is irradiated to a sample, thereby returning light from the sample can be more securely detected.

A sixth aspect of the present invention is a laser scanning microscope including the light source apparatus of the second aspect, a scan section that two-dimensionally scans laser light emitted from the light source apparatus; an objective lens that irradiates the laser light scanned by the scan section to a sample, and collects returning light returning from the sample; a plurality of light detectors having different detection timing, which detect the returning light being collected by the objective lens, and returning via the scan section; and a detector switching section that switches between the light detectors when the circuit switching section switches between the first and second laser diode drive circuits.

According to the sixth aspect of the present invention, when the circuit switching section of the light source apparatus switches between the first and second laser diode drive circuits, the detector switching section switches between the light detectors having different detection timing depending on a type of laser light emitted from the light source. This enables more secure detection of returning light from the sample caused by irradiating each type of laser light depending on a type of laser light emitted from the light source.

A seventh aspect of the present invention is a laser scanning microscope including the light source apparatus of the second aspect, a scan section that two-dimensionally scans laser light emitted from the light source apparatus; an objective lens that irradiates the laser light scanned by the scan section to a sample, and collects returning light returning from the sample; a light detector that detects the returning light being collected by the objective lens, and returning via the scan section; and a timing switching section that switches at least one of detection timing of the light detector and a detection circuit when the circuit switching section switches between the first and second laser diode drive circuits.

The invention exhibits an advantage that both of highly stable light having the same optical performance and fast-modulated light can be emitted simply and inexpensively.

BRIEF DESCRIPTION OF THE SEVERAL
VIEWS OF THE DRAWINGS

Figure 2:
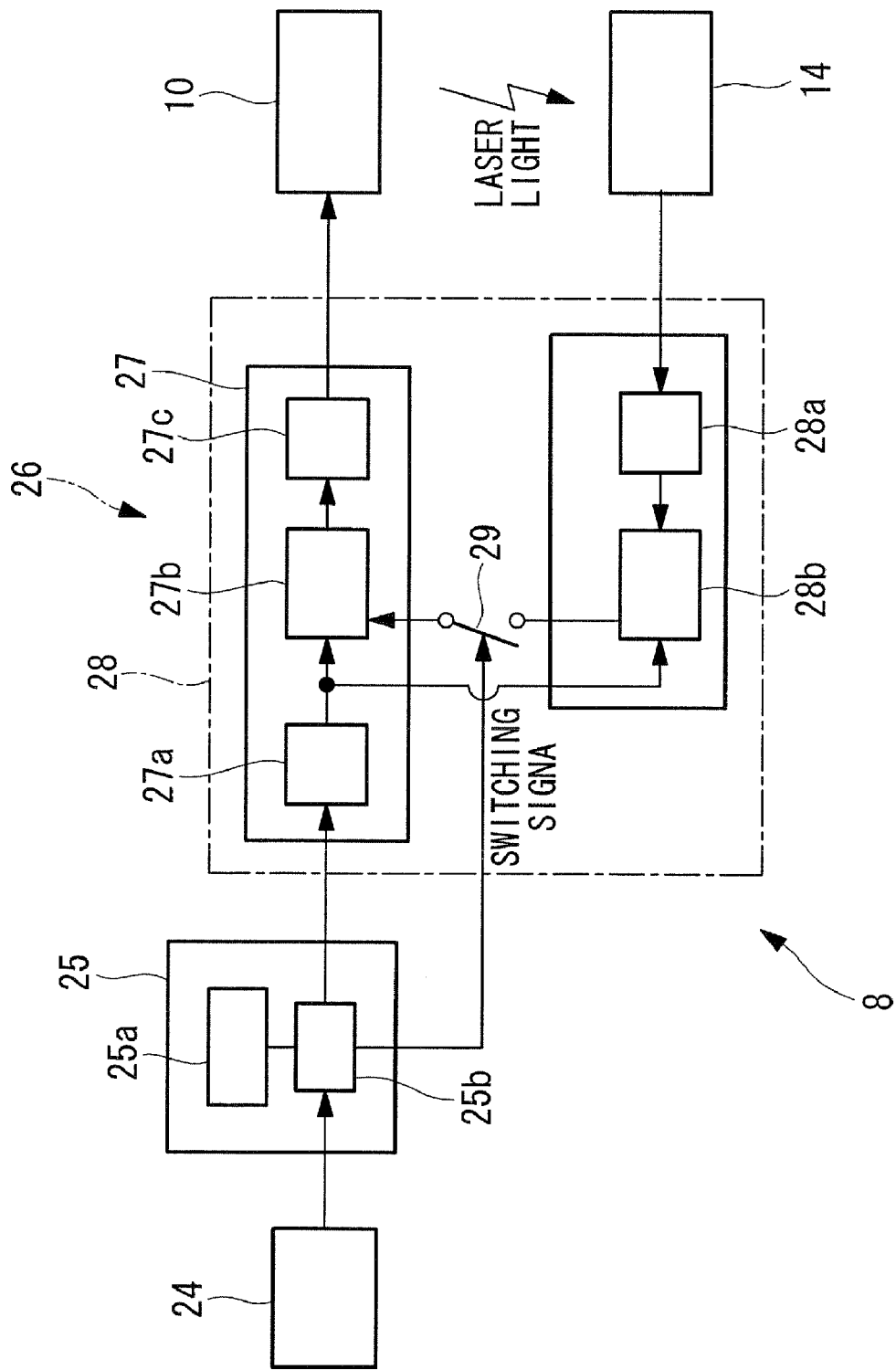
FIG. 2 shows a block diagram showing a light source apparatus according to the embodiment for use in the laser scanning microscope of FIG. 1.
Figure 12:
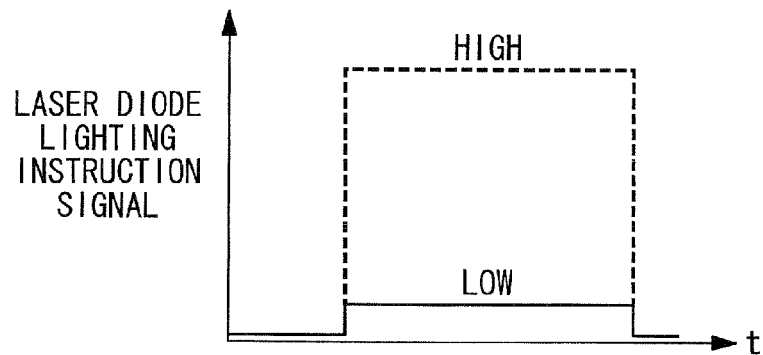
Figure 13:
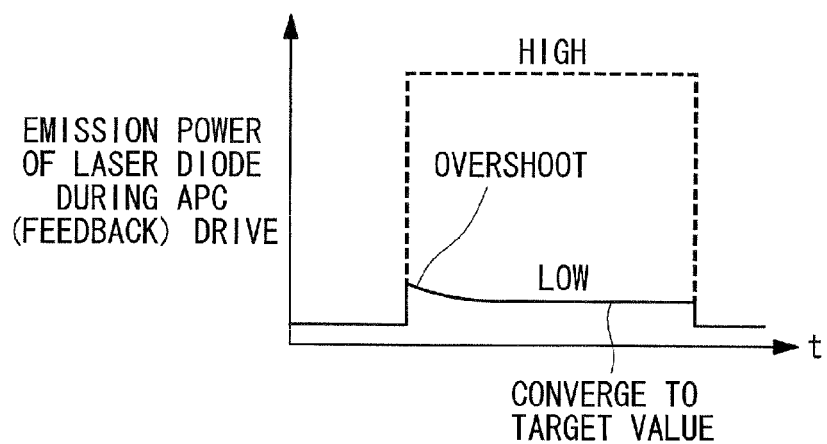
Figure 14:
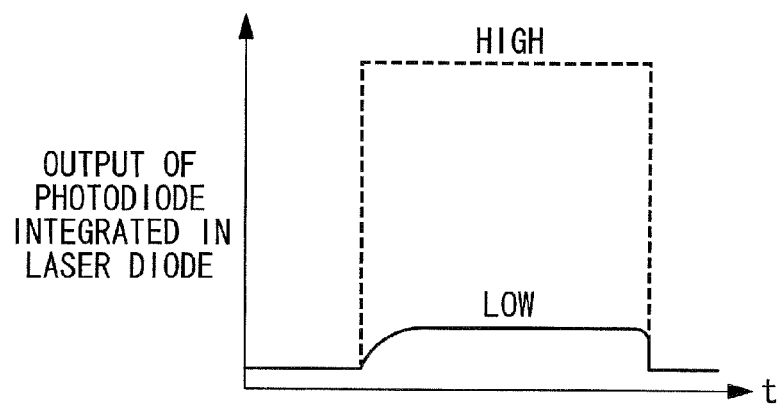

FIG. 12 snows a graph showing temporal change (target value) of the light quantity of laser light given by a lighting instruction signal in the case that a feedback circuit is configured in the light source apparatus of FIG. 2;

FIG. 13 shows a graph showing temporal change of light quantity of laser light compared with the target value when the light quantity overshoots in low power in the case that the feedback circuit is configured in the light source apparatus of FIG. 2; and FIG. 14 shows a graph showing temporal change of light quantity of actual laser light at low response speed of a photodiode incorporated in a laser diode in the case that the feedback circuit is configured in the light source apparatus of FIG. 2.

DETAILED DESCRIPTION OF THE INVENTION

First Embodiment

Hereinafter, a light source apparatus 1 and a laser scanning microscope 2 according to a first embodiment of the present invention will be described with reference to FIGS. 1 and 2.

Figure 1:
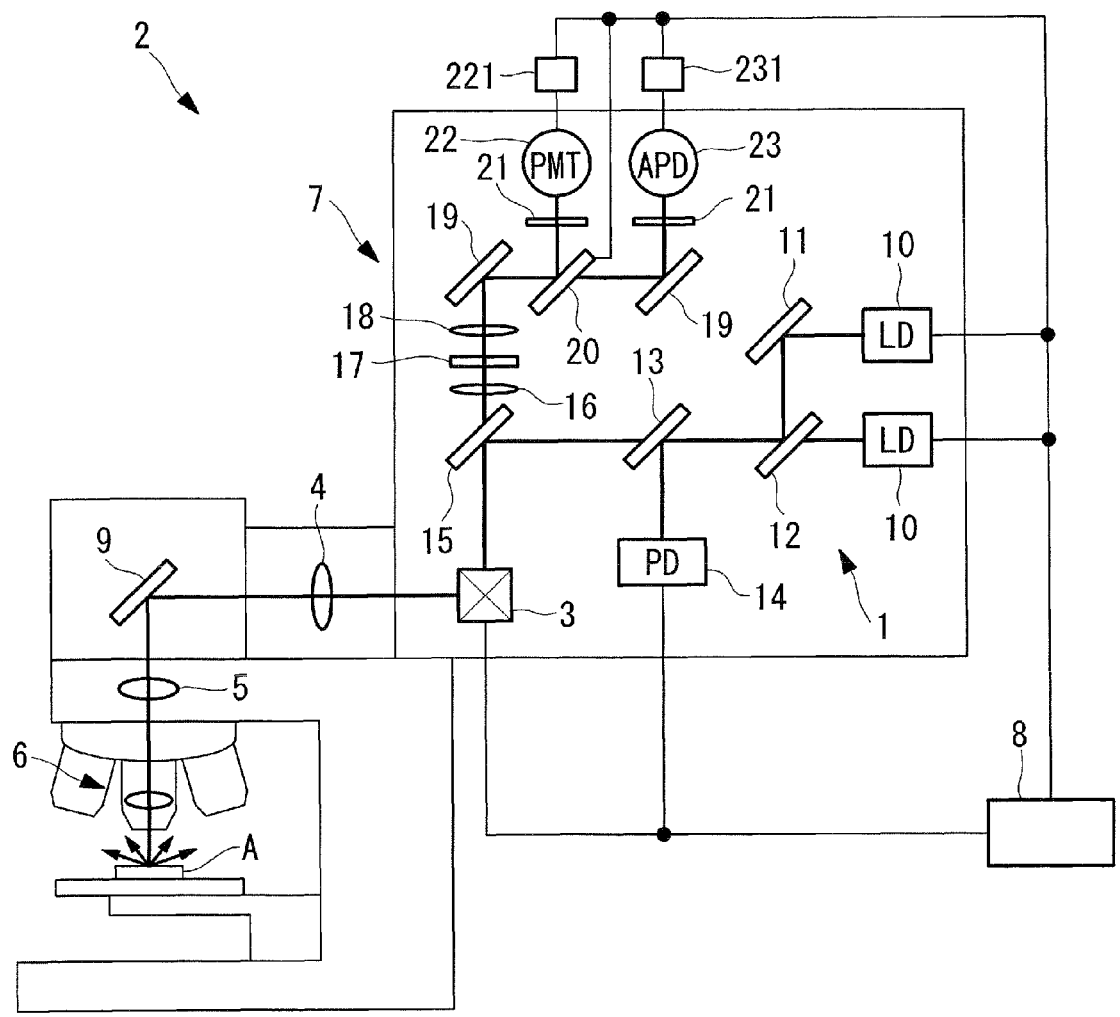
FIG. 1 shows a general block diagram showing a laser scanning microscope according to a first embodiment of the present invention.

As shown in FIG. 1, the laser scanning microscope 2 according to the embodiment includes the light source apparatus 1 that emits laser light; a scanner (scan section) 3 that two-dimensionally scans the laser light emitted from the light source apparatus 1; a pupil projection lens 4 and an imaging lens 5 that condense the laser light scanned by the scanner 3; an objective lens 6 that irradiates the condensed laser light to a sample A, and collects returning light returning from the sample A; a light detection section 7 that detects the returning light being collected by the objective lens 6, and returning via the imaging lens 5, the pupil projection lens 4, and the scanner 3; and a controller 8 for controlling these. In the figure a symbol 9 shows a mirror.

The light source apparatus 1 includes a plurality of laser diode elements 10 that emit laser light having different wavelengths, a mirror 11 and a dichroic mirror 12 that allow laser light from the laser diode elements 10 to join into the same optical path, a beam splitter 13 that branches part of the laser light emitted from the laser diode elements 10, and a photodiode 14 that detects the branched laser light.

The light detection section 7 includes a dichroic mirror that branches the returning light returning via the scanner 3 from an optical path of the laser light, a confocal lens 16, a confocal pin hole 17, a condensing lens 18, mirrors 19 and a beam splitter 20, barrier filters 21, and light detectors 22 and 23. The light detectors 22 and 23 include a first light detector (APD: Avalanche photodiode) 23 that detects fast-modulated, pulsed returning light, and a second light detector (PMT: photomultiplier) 22 that detects stably continued. continuous returning light. The PMT 22 and APD 23 are connected to detection circuits 221 and 231 respectively, each detection circuit integrating an output signal and performing A/D conversion of the integrated signal. Sampling timing (speed) of the detection circuits 221 and 231 are set by the controller 8 in accordance with characteristics of the detectors 22 and 23 respectively. Since the APD 23 may detect light at high speed compared with the PMT 22, sampling timing of the detection circuit 231 for the APD 23 is set short compared with sampling timing of the detection circuit 221 for the PMT 22.

As shown in FIG. 2, the controller 8 includes an input section 24 to be inputted with a dimming value, an observation mode, and modulation timing, a drive command 25 that outputs a drive instruction signal for the laser diode elements 10 on the basis of the dimming value and the observation mode inputted from the input section 24, and a laser diode drive circuit 26 that generates a current signal to be inputted into the laser diode elements 10 according to the drive instruction signal from the drive command 25.

The observation mode includes a high resolution mode such as a mode in long time-lapse observation or fluorescence correlation spectroscopy (FCS) observation, and a high speed mode such as a mode in fluorescence lifetime measurement, fluorescence frequency separation, or pulse width modulation (PWM) in a low power region. In the high resolution mode, continuous laser light being stable for a long time is desired to be irradiated, and in the high speed mode, fast-modulated laser light, for example, pulsed laser light is desired to be irradiated.

The laser diode drive circuit 26 includes a first laser diode drive circuit 27 that outputs a current signal according to the instruction signal from the drive command 25, and a second laser diode drive circuit 28 that includes the first laser diode drive circuit 27, and controls a current signal to be inputted into the laser diode elements 10 on the basis of the light quantity of laser light detected by the photodiode 14, and a changeover switch 29 that changes between the laser diode drive circuits 27 and 28.

The drive command 25 has a memory 25a that stores offset and gain for finely adjusting a drive instruction signal being changed when the observation mode is changed. The offset and the gain are used to adjust the drive instruction signals outputted from the two laser diode drive circuits 27 and 28 respectively such that a level of either signal perfectly corresponds to one target value. That is, when the high resolution mode is assumed to be inputted as an observation mode, $V_{slow}$ is outputted as the drive instruction signal, and when the high speed mode is inputted as an observation mode, $V_{fast}=V_{slow}*gain+offset$ is assumed to be outputted as the drive instruction signal. Obviously, such signal levels may be converted with $V_{fast}$ as a reference, or a different, absolute reference value may be set. The drive command 25 turns on or off the changeover switch 29 depending on the observation mode to be inputted, and when the high speed mode is inputted, the section 25 reads offset and gain from the memory 25a to calculate a drive instruction signal. In the figure, a symbol 25b shows CPU that performs the calculation.

The first laser diode drive circuit 27 includes a D/A converter 27a that converts a drive instruction signal including a digital signal from the drive command 25 into a voltage signal, an adder 27b, and a V/I converter 27c that converts a voltage signal into a current signal.

The second laser diode drive circuit 28 further includes an I/V converter 28a that converts a detection signal including a current signal from the photodiode 14 into a voltage signal, and a comparator 28b that compares between the detection signal converted into the voltage signal by the I/V converter 28a and the drive instruction signal converted into the voltage signal by the D/A converter 27a of the first laser diode drive circuit 27.

When the high resolution mode is selected as the observation mode, the changeover switch 29 is turned on, thereby the switch 29 connects the comparator 28b in the second laser diode drive circuit 28 to the adder 27b in the first laser diode drive circuit 27 so that an output signal from the comparator 28b is inputted into the adder 27b. When the high speed mode is selected as the observation mode, the changeover switch 29 is turned off so that the comparator 28b is disconnected from the adder 27b.

The controller 8 switches between the light detectors 22 and 23 on the basis of on the observation mode inputted from the input section 24. That is, when the high resolution mode is inputted to perform high resolution observation, the PMT (photomultiplier) 22 is selected as the light detector, and when the high speed mode is inputted to perform high speed observation, the APD (avalanche photodiode) 23 is selected as the light detector. Switching between the light detectors 22 and 23 is performed by, for example, switching the beam splitter 20 so as to switch a detection light path, as shown in FIG. 1.

Operation of the laser scanning microscope 2 according to the embodiment configured in this way is described below.

When high resolution observation of the sample A is performed using the laser scanning microscope 2 according to the embodiment, a dimming value and the high resolution mode are inputted from the input section 24.

The drive command 25 generates the drive instruction signal $V_{slow}$ on the basis of the inputted dimming value and outputs the signal $V_{slow}$ while switching the changeover switch 29 to be on. Thus, a current signal according to the drive instruction signal $V_{slow}$ is outputted to the laser diode elements 10, and laser light having the light quantity according to the drive instruction signal $V_{slow}$ is emitted from the laser diode elements 10.

Laser light is partially detected by the photodiode 14 and thus fed back via a feedback circuit configured by the comparator 28b and the adder 27b. Thus, laser light is emitted from laser diode elements 10 while stability of its light quantity is kept high such that the light quantity hardly varies.

When the high resolution mode is inputted from the input section 24, the controller 8 switches the beam splitter 20 so that the PMT 22 detects returning light. Thus, the PMT 22 detects continuous returning light obtained by irradiating laser light having the stable light quantity, and consequently high resolution observation can be made.

Next, the dimming value, the high speed mode, and the modulation timing are inputted from the input section 24 to make high speed observation of the sample A by means of the laser scanning microscope 1 according to the embodiment.

The drive command 25 generates the drive instruction signal $V_{fast}$ on the basis of the inputted dimming value and modulation timing, and outputs the signal $V_{fast}$ while switching the changeover switch 29 to be off. Thus, a current signal according to the drive instruction signal $V_{fast}$ is outputted to the laser diode elements 10, and laser light having the light quantity according to the drive instruction signal $V_{fast}$ is emitted from the laser diode elements 10.

At that time, since the changeover switch 29 disconnects the feedback circuit, fast-modulated laser light, having the light quantity determined by only the drive instruction signal $V_{fast}$ from the drive command 25, is emitted.

When the high speed mode is inputted from the input section 24, the controller 8 switches the beam, splitter 20 so that the APD 23 detects returning light. Thus, the returning light can be detected at fast detection timing following fast-modulated laser light emitted from the laser diode elements 10, and consequently quick motion of the sample A can be observed more accurately.

In this way, according to the light source apparatus 1 and the laser scanning microscope 2 according to the embodiment, when the high resolution mode is selected, the laser light having the stable light quantity is continuously irradiated so that high resolution observation can be made. When high speed observation is made, since the laser light modulated at high frequency is not fed back, which eliminates the difficulty of stray capacitance or response speed of the feedback circuit, and consequently observation can be made more accurately.

In addition, according to the light source apparatus 1 and the laser scanning microscope 2 according to the embodi-ment, the laser diode elements 10 generating laser light having the same wavelength can emit both of the highly stable laser light in the high resolution mode, and fast-modulated laser light in the high speed mode, leading to an advantage that an installation space is reduced so that cost is suppressed, and an advantage that beam diameter and a beam divergence angle are made equal in either mode so that the same optical resolution can be achieved in either mode.

Figure 3:
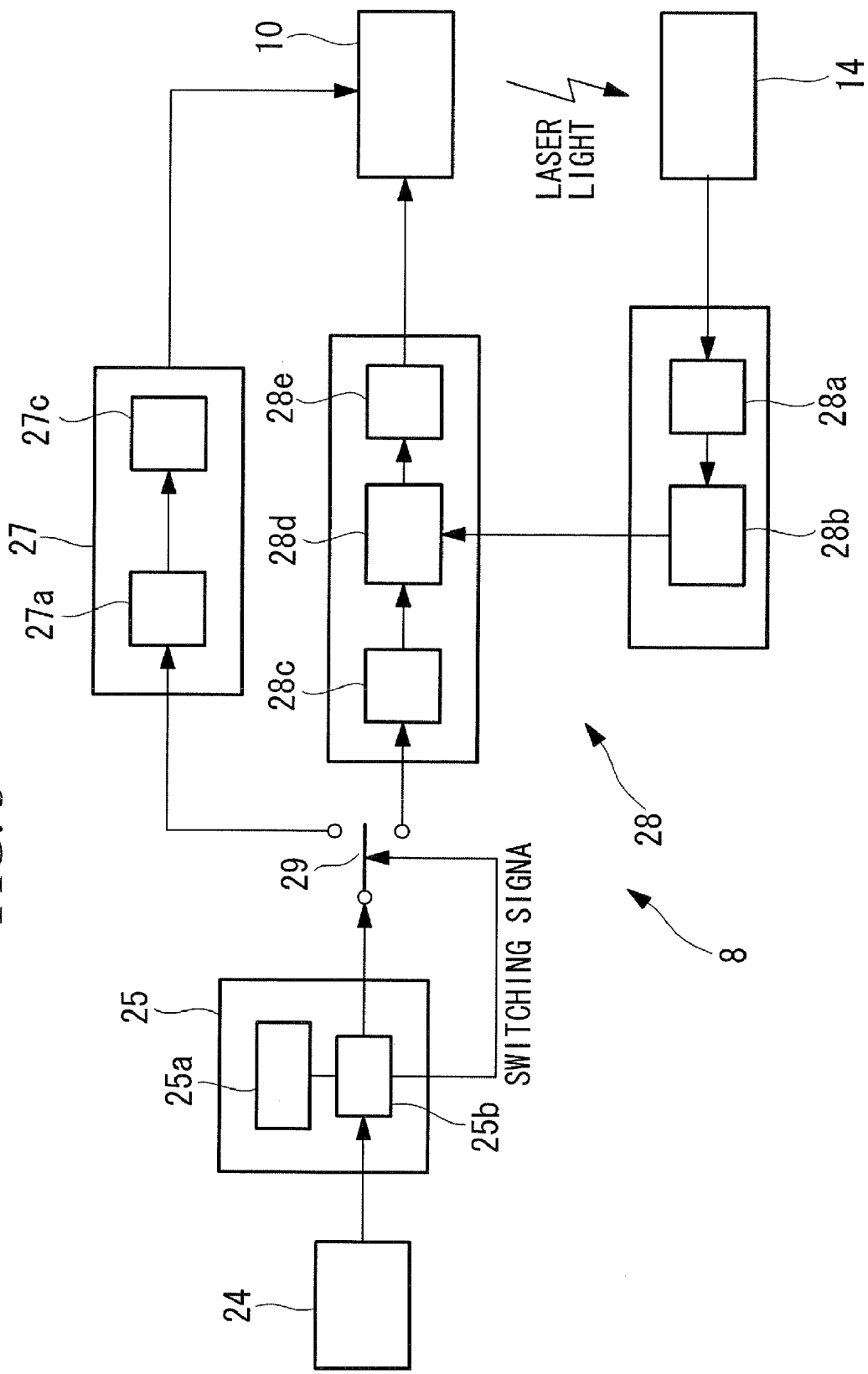
FIG. 3 shows a block diagram showing a first modification of the light source apparatus of FIG. 2.

In the light source apparatus 1 according to the embodiment, the second laser diode drive circuit 28 for high resolution observation is formed by adding the feedback circuit to the first laser diode drive circuit 27. However, in place of this, the first laser diode drive circuit 27 and the second laser diode drive circuit 28 may be separately provided so that the changeover switch 29 switches between the separated laser diode drive circuits 27 and 28, as shown in FIG. 3.

In this case, the second laser diode drive circuit 28 needs to have a D/A converter 28c, an adder 28d, and a V/I converter 28e.

By configuring in this way, as the two laser diode drive circuits 27 and 28, a drive circuit that can be modulated at high speed, and a drive circuit having a current stabilizing circuit, an offset adjusting mechanism, and a gain adjusting mechanism, which are suitable for the observation modes respectively, can be further advantageously used.

Figure 4:
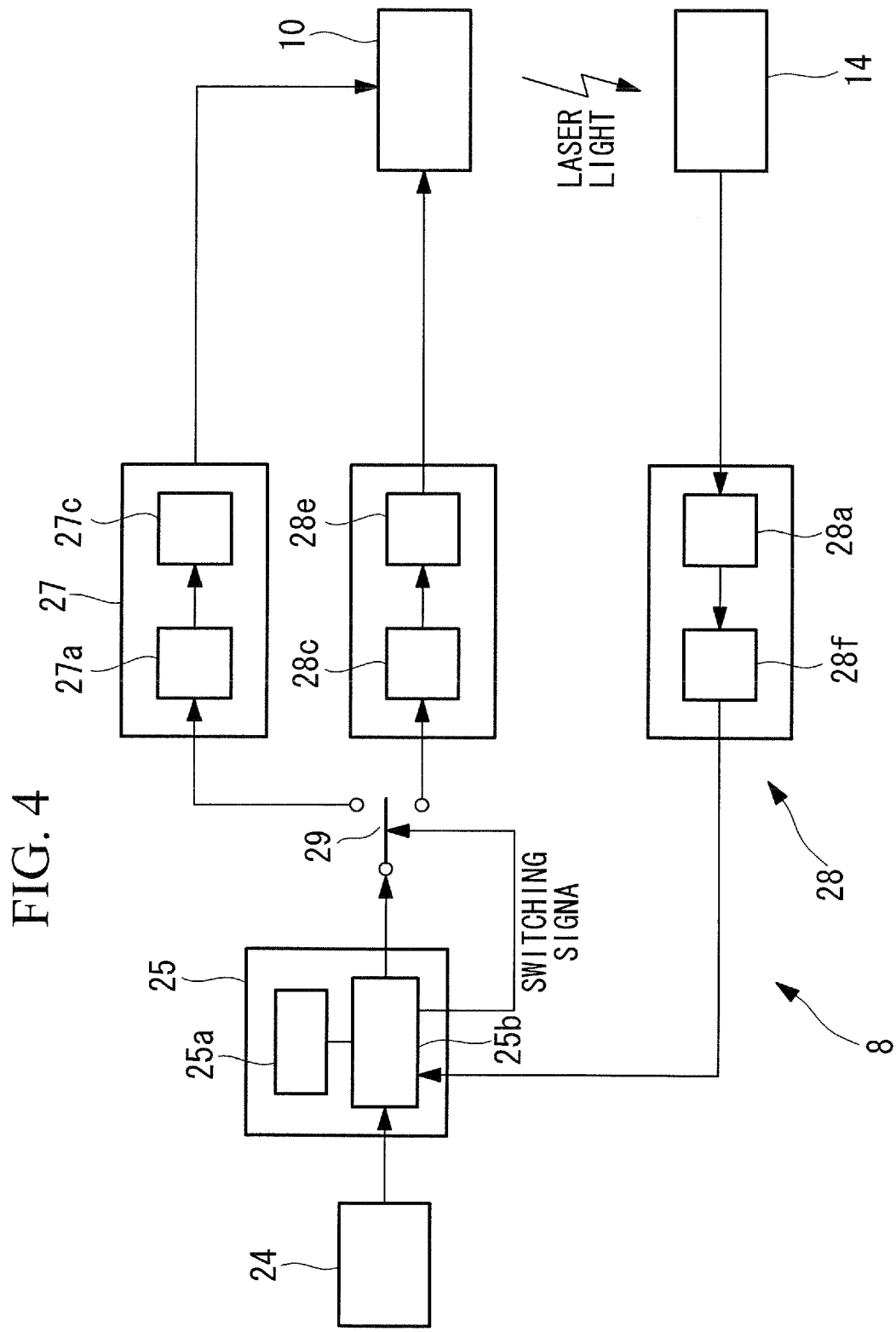
FIG. 4 shows a block diagram showing a second modification of the light source apparatus of FIG. 2.

In the embodiment, the first laser diode drive circuit 27 has the adder 27b, and a deviation signal between the detection signal from, the photodiode 14 and the drive instruction signal is returned to the adder 27b, so that the feedback circuit is configured. However, in place of this, as shown in FIG. 4, a feedback circuit may be configured by returning the detection signal from the photodiode 14 to the drive command 25. In this case, the second laser diode drive circuit 28 needs to have an A/D converter 28f. Even in this case, drive circuits suitable for respective observation modes may be used as the two laser diode drive circuits 27 and 28.

In the embodiment, laser light emitted from the laser diode elements 10 is partially branched and detected by the photodiode 14. However, in place of this, laser diode elements 10 with a photodiode 14 may be used.

Second Embodiment

Figure 9:
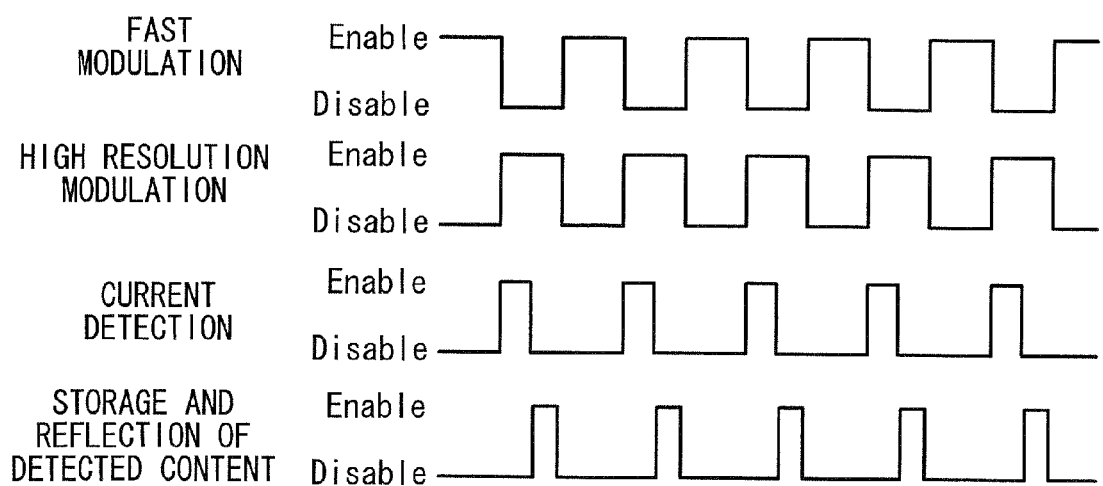
FIG. 9 shows a diagram showing a timing chart for achieving the light quantity of laser light in the high speed mode in FIG. 8.

Next, a light source apparatus and a laser scanning microscope according to a second embodiment are described below with reference to FIGS. 5 and 9.

In description of the embodiment, a portion having a configuration common to a portion in the light source apparatus 1 according to the first embodiment is marked with the same symbol, and description of the portion is omitted.

Figure 5:
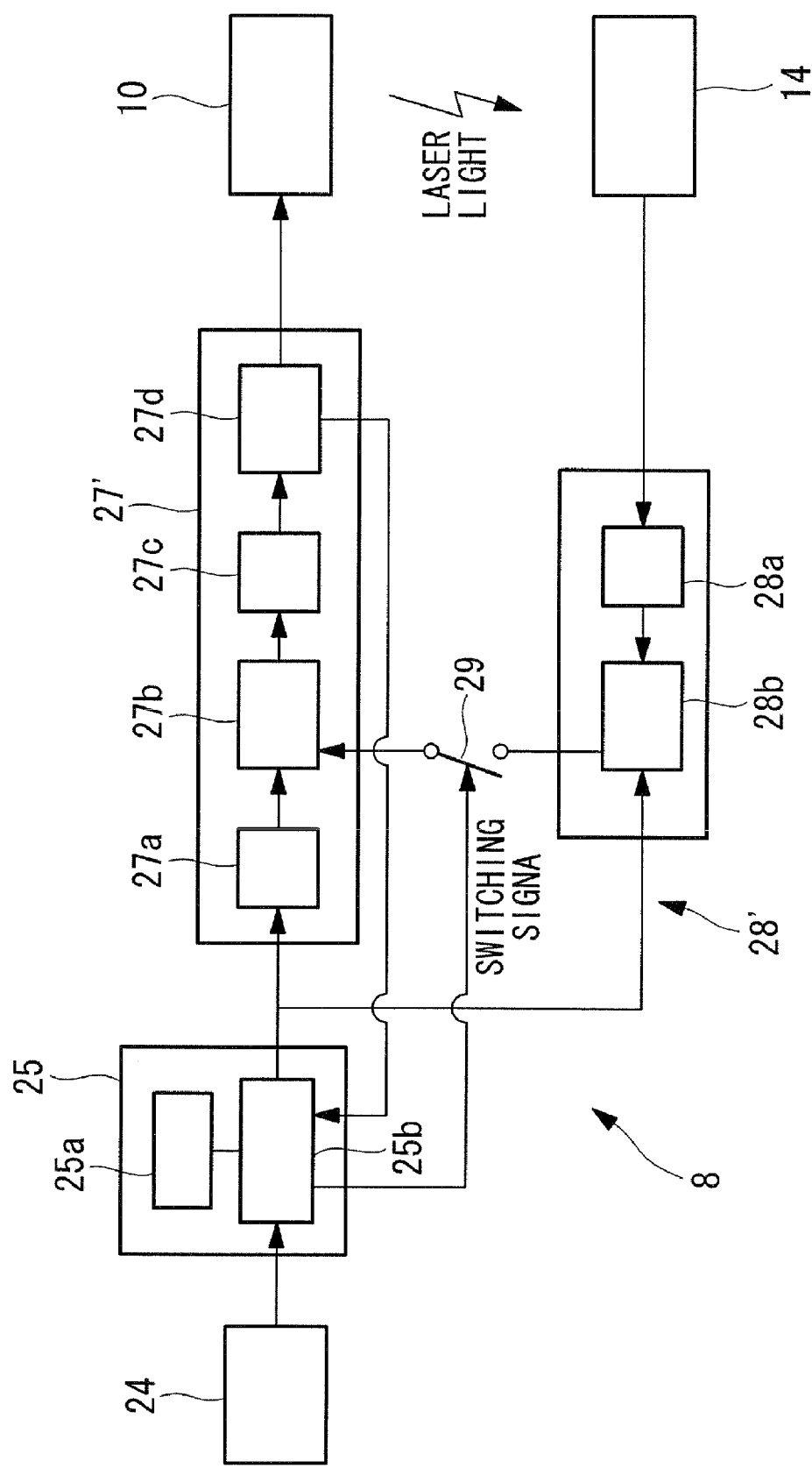
FIG. 5 shows a block diagram showing a light source apparatus according to a second embodiment of the present invention.

As shown in FIG. 5, the light source apparatus according to the embodiment is different from the light source apparatus 1 according to the first embodiment in that a galvanometer 27d for detecting a current signal for driving the laser diode elements 10 is provided in a first drive circuit 27', a detection signal given by the galvanometer 27c is inputted into the drive command 25, the drive command 25 stores a drive instruction signal and the detection signal by the galvanometer 27d while relating the signals to each other, and the CPU 25b generates a drive instruction signal on the basis of the stored relation between the drive instruction signal and the detection signal.

Figure 6:
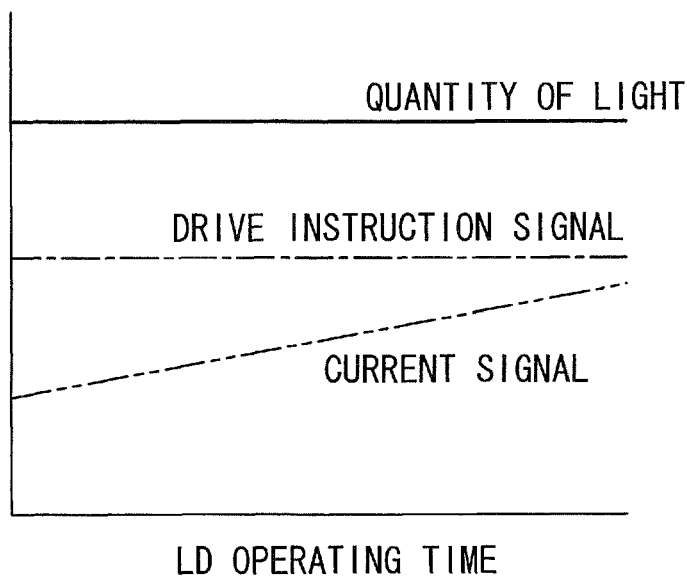
FIG. 6 shows a graph showing temporal change of a drive instruction signal, a current signal, and light quantity of laser light in a high resolution mode when laser diode elements are degraded in the light source apparatus of FIG. 5.

More specifically, when the high resolution mode is selected as the observation mode, laser light having a certain light quantity is stably emitted from the laser diode elements 10 according to the drive instruction signal. If the laser diode elements 10 are degraded, a current signal, being inputted into the laser diode elements 10 to allow the elements 10 to emit laser light having the same light quantity, automatically increases irrespective of the drive instruction signal as shown in FIG. 6.

Figure 7:
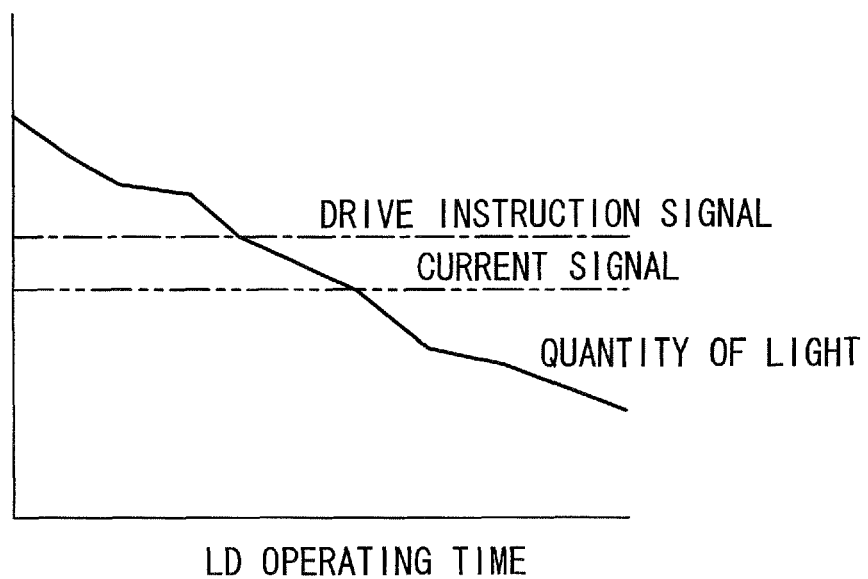
FIG. 7 shows a graph showing temporal change of a drive instruction signal, a current signal, and light quantity of laser light in a high speed mode when laser diode elements are degraded in the light source apparatus of FIG. 2.

In this case, in the case of the first embodiment, when the high speed mode is selected as the observation mode, a current signal according to the drive instruction signal is inputted into the laser diode elements 10 irrespective of degradation of the laser diode elements 10, therefore the light quantity of laser light emitted from the laser diode elements 10 decreases as shown in FIG. 7.

Figure 8:
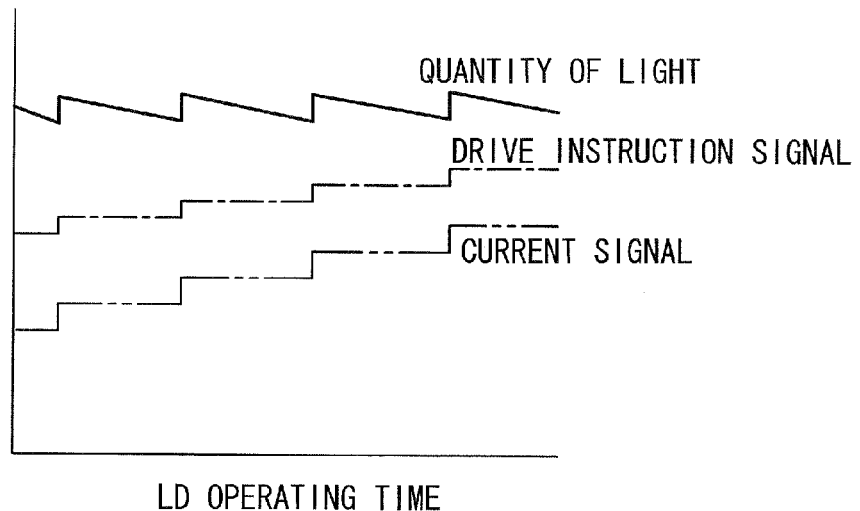
FIG. 8 shows a graph showing temporal change of a drive instruction signal, a current signal, and light quantity of laser light in the high speed mode when laser diode elements are degraded in the light source apparatus of FIG. 5.

On the other hand, in the light source apparatus 1' according to the embodiment, using a fact that a current signal is automatically adjusted by the feedback circuit in the high resolution mode, the memory 25a stores a relationship between the current signal and the drive instruction signal in the high resolution mode, and in the high speed mode, a drive instruction signal for giving desired quantity of light can be generated based of the stored relationship between the current signal and the drive instruction signal. This leads to an advantage that laser light having stable quantity of light can be emitted not only in the high resolution mode but also in the high speed mode irrespective of degradation of the laser diode elements 10 as shown in FIG. 8.

In this case, a current signal detected in the high resolution mode is used in the high speed mode. Therefore, the current signal needs to be detected regularly or as needed in the high resolution mode prior to the high speed mode.

In the laser scanning microscope according to the embodiment, for example, in a blanking period of the scanner 3 during observation in the high speed mode, a mode is changed into the high resolution mode and a current signal is detected, and a result of such detection is reflected to observation in the high speed mode, consequently a drive instruction signal can be effectively generated depending on a preceding scare of the laser diode elements 10.

Figure 10:
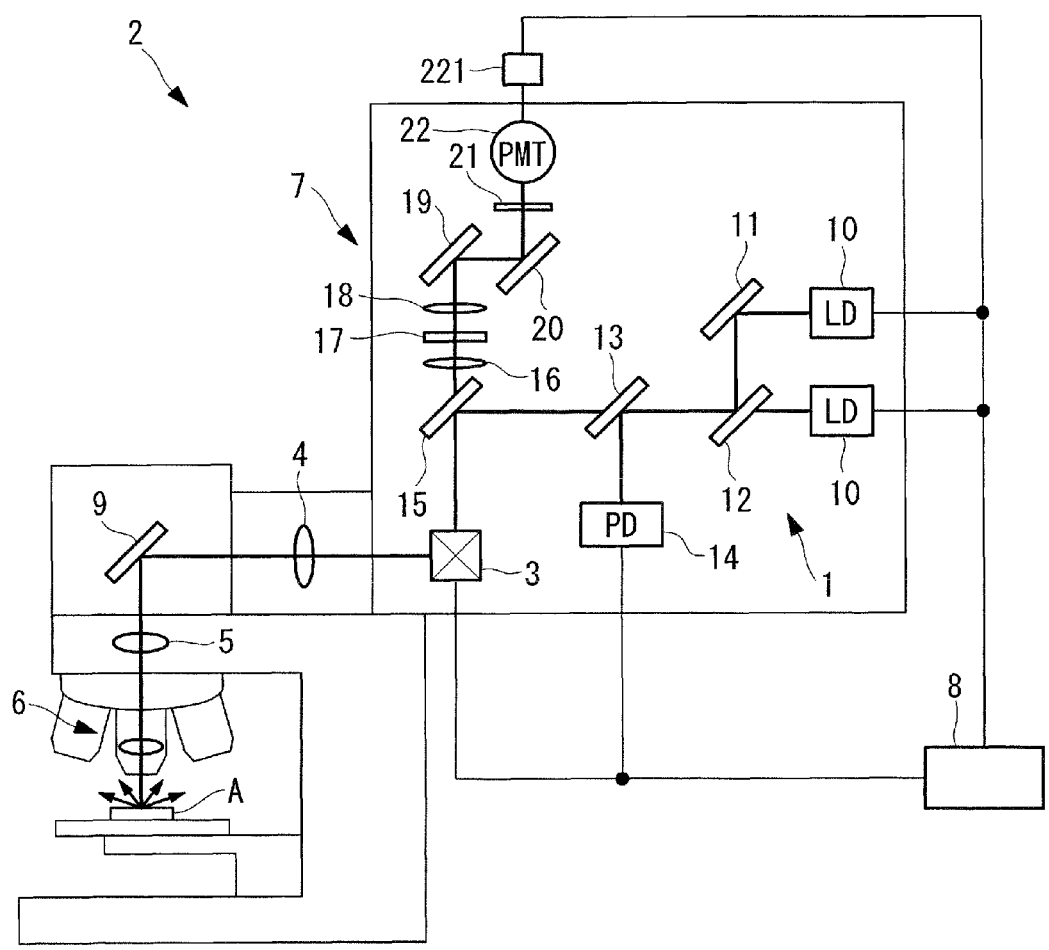
FIG. 10 shows a general block diagram showing a modification of the laser scanning microscope of FIG. 1.
Figure 11:
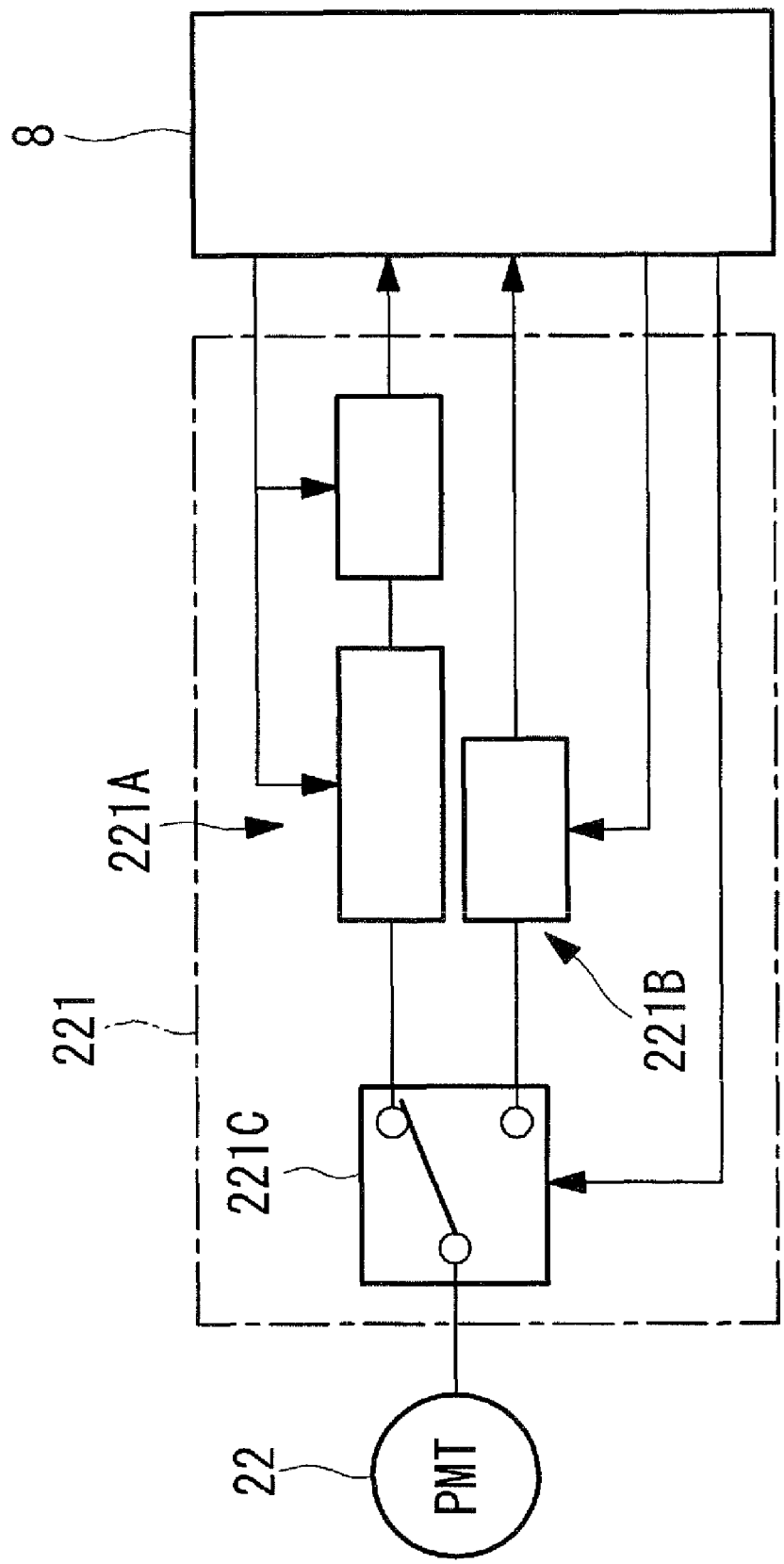
FIG. 11 shows a block diagram showing an internal structure example of a detection circuit of the laser scanning microscope of FIG. 10.

In the embodiment, as shown in FIGS. 10 and 11, two systems of switchable circuits 221A and 221B may be provided in the detection circuit 221, so that a switch 221C in the detection circuit 221 may be switched in synchronization with switching between the laser diode drive circuits 27 and 28.

The circuit 221A includes an integrating circuit and an A/D converter, and selected in the high resolution mode. The circuit 221B includes only an A/D converter, and selected in the high speed mode.

The detection circuit 221 may be configured by only one system of the circuit 221A without providing the switch 221C therein. In such a case, integration time of the integrating circuit or a sampling rate of the A/D converter can be changed in synchronization with switching between the laser diode drive circuits 27 and 28.

Even in the case that switching is performed between the two systems of circuits 221A and 221B, integration time of the integrating circuit or a sampling rate of the A/D converter may be changed in synchronization with switching between the laser diode drive circuits 27 and 28.

When the high speed mode is selected and the laser diode drive circuit is switched to the first laser diode drive circuit 27, the integration time or the sampling rate may be changed depending on frequency of the pulse laser light.

Third Embodiment

A light source apparatus 1 according to a third embodiment is described below with reference to FIGS. 12 to 14.

In the past, in the case that modulation is performed at low frequency, when feedback is made using a detector such as photodiode, response speed varies depending on lighting power, and therefore stability of light has been reduced. This is because when lighting power is low, some kind of photodiode incorporated in a laser diode is low in response speed (requires much time before stabilizing) as shown in FIG. 14, therefore when a feedback circuit is configured, although a lighting instruction signal gives a target value as shown in FIG. 12, actual output Inconveniently overshoots the target value as shown in FIG. 13. Therefore, an external photodiode has been usually additionally needed for feedback, leading to increase in size of an optical system, and increase in cost.

Thus, the light source apparatus 1 of the embodiment is configured such that in the light source apparatus 1 according to the first embodiment, the first laser diode drive circuit 27 is used when output power of the laser diode elements 10 is low, and the second laser diode drive circuit 28 is used when output power of the laser diode elements 10 is high.

In the embodiment, feedback is stopped when lighting power is low, which may prevent the phenomenon that some kind of photodiode incorporated in a laser diode is reduced in response speed (requires much time before stabilizing), leading to overshoot of accrual output. Therefore, even if modulation is performed at low frequency, an external photodiode needs not be additionally provided, consequently an optical system is not increased in size, and stable light can be obtained at a low cost.

The embodiment in the low power may be achieved by modifying the first embodiment. That is, "high speed mode" in the first embodiment is changed for a low power mode, and "high resolution mode" is changed for a high power mode. By modifying in this way, a mode and an instruction signal are modified as follows respectively.

When output intensity of laser is inputted from the input section 24, and set in the controller, the controller 8 (CPU 25b) determines whether a mode is the low power mode or the high power mode depending on the set intensity. As a criterion, for example, 1% of maximum output of a laser diode is used.

When an instruction signal in the low power mode is assumed as $V_{slow}$, and an instruction signal in the high power mode is assumed as $V_{high}$, $V_{slow}=V_{high}*gain+offset$ is outputted. When the low power mode is inputted, the drive command 25 reads offset and gain from the memory 25a and thus calculates a drive instruction signal. After that, the same operation is performed as in the first embodiment, therefore description of the operation is omitted.

Fourth Embodiment

Next, a fourth embodiment of the invention is described below.

A light source apparatus 1 of the embodiment is configured such that the light source apparatus 1 according to the third embodiment further includes a current detection section 27d that detects a current signal value to be outputted to the laser diode elements 10 when the second laser diode drive circuit 28 is selected; a storage section 25 that stores the current signal value detected by the current detection section 27d and light quantity of laser light detected by a light receiving element while relating the signal value and the light quantity to each other; and an instruction signal correction section 25b that corrects an instruction signal to be inputted into the first laser diode drive circuit 27 on the basis of the current signal value and the light quantity stored in the storage section 25 when the first laser diode drive circuit 27 is selected.

In the light source apparatus 1 according to the embodiment, using a fact that a current signal is automatically adjusted by the feedback circuit in the high power mode, a relationship between a current signal and a drive instruction signal in such automatic adjustment is stored in the memory 25a, and in the low power mode, a drive instruction signal for giving desired light quantity can be generated on the basis of the stored relationship between the current signal and the drive instruction signal. Thus, laser light having the stable light quantity can be emitted even in the low power mode.

The embodiment may be combined with the second embodiment of the invention and may be carried out at the same time. In such a case, when an observation mode is the high resolution mode and a setting power mode is the high power mode, feedback control is performed, and in other cases (a case of the high speed mode, and a case of the high resolution mode and the low power mode), feedback is stopped. Feedback is stopped in the low power mode, which eliminates influence of a bad response characteristic of a photodiode incorporated in each laser diode in low power mode, consequently stable light can be obtained, and observation can be made more accurately.

The laser diode is a type of semiconductor laser.

What is claimed is:

1. A light source apparatus comprising:
    semiconductor laser elements that emit laser light according to an inputted current signal,
    a light receiving element that receives the laser light emitted from the semiconductor laser elements, and
    a controller that controls light emission of the semiconductor laser elements,
    wherein the controller includes:
        a first semiconductor laser element drive circuit that outputs a current signal to the semiconductor laser elements according to an instruction signal,
        a second semiconductor laser element drive circuit that adjusts the current signal based on a light quantity of the laser light received by the light receiving element, and outputs the adjusted current signal to the semiconductor laser elements, and
        a circuit switching section that switches between the first semiconductor laser element drive circuit and the second semiconductor laser element drive circuit according to an instruction signal,
    wherein the first semiconductor laser element drive circuit outputs a current signal to allow the semiconductor laser elements to emit pulsed laser light, and
    wherein the second semiconductor laser element drive circuit is used when a current signal is outputted to allow the semiconductor laser elements to emit continuous laser light.

2. The light source apparatus according to claim 1, further comprising:
    a current detection section that detects a current signal value to be outputted to the laser diode elements when the second semiconductor laser element drive circuit is selected, a storage section that stores the current signal value detected by the current detection section and the light quantity of the laser light detected by the light receiving element while relating the signal value and the light quantity to each other, and
    an instruction signal correction section that corrects an instruction signal to be inputted into the first semiconductor laser element drive circuit based on the current signal value and the light quantity stored in the storage section when the first semiconductor laser element drive circuit is selected.

3. The light source apparatus according to claim 1, wherein:

the first semiconductor laser element drive circuit is used when an output power of the semiconductor laser elements is low, and
the second semiconductor laser element drive circuit is used when the output power of the semiconductor laser elements is high.

4. The light source apparatus according to claim 3, further comprising:
    a current detection section that detects a current signal value to be outputted to the semiconductor laser elements when the second semiconductor laser element drive circuit is selected,
    a storage section that stores the current signal value detected by the current detection section and the light quantity of the laser light detected by the light receiving element while relating the signal value and the light quantity to each other, and
    an instruction signal correction section that corrects an instruction signal to be inputted into the first semiconductor laser element drive circuit based on the current signal value and the light quantity stored in the storage section when the first semiconductor laser element drive circuit is selected.

5. A laser scanning microscope comprising:
    a light source apparatus including:
        semiconductor laser elements that emit laser light according to an inputted current signal,
        a light receiving element that receives the laser light emitted from the semiconductor laser elements, and
        a controller that controls light emission of the semiconductor laser elements,
        wherein the controller includes:
        a first semiconductor laser element drive circuit that outputs a current signal to the semiconductor laser elements according to an instruction signal,
        a second semiconductor laser element drive circuit that adjusts the current signal based on a light quantity of the laser light received by the light receiving element, and outputs the adjusted current signal to the semiconductor laser elements, and
        a circuit switching section that switches between the first semiconductor laser element drive circuit and the second semiconductor laser element drive circuit according to an instruction signal,
        wherein the first semiconductor laser element drive circuit outputs a current signal to allow the semiconductor laser elements to emit pulsed laser light, and
        wherein the second semiconductor laser element drive circuit is used when a current signal is outputted to allow the semiconductor laser elements to emit continuous laser light;
    a scan section that two-dimensionally scans laser light emitted from the light source apparatus,
    an objective lens that irradiates the laser light scanned by the scan section to a sample, and collects returning light returning from the sample, and
    a light detection section that detects the returning light being collected by the objective lens, and returning via the scan section.

6. The laser scanning microscope according to claim 5, wherein the light source apparatus further comprises:
    a current detection section that detects a current signal value to be outputted to the laser diode elements when the second semiconductor laser element drive circuit is selected,
    a storage section that stores the current signal value detected by the current detection section and the light quantity of the laser light detected by the light receiving element while relating the signal value and the light quantity to each other, and an instruction signal correction section that corrects an instruction signal to be inputted into the first semiconductor laser element drive circuit based on the current signal value and the light quantity stored in the storage section when the first semiconductor laser element drive circuit is selected.

7. The laser scanning microscope according to claim 5, wherein:

the first semiconductor laser element drive circuit is used when an output power of the semiconductor laser elements is low, and the second semiconductor laser element drive circuit is used when the output power of the semiconductor laser elements is high.

8. The laser scanning microscope according to claim 7, wherein the light source apparatus further comprises:

a current detection section that detects a current signal value to be outputted to the semiconductor laser elements when the second semiconductor laser element drive circuit is selected, a storage section that stores the current signal value detected by the current detection section and the light quantity of the laser light detected by the light receiving element while relating the signal value and the light quantity to each other, and an instruction signal correction section that corrects an instruction signal to be inputted into the first semiconductor laser element drive circuit based on the current signal value and the light quantity stored in the storage section when the first semiconductor laser element drive circuit is selected.

9. A laser scanning microscope comprising:

a light source apparatus including:

semiconductor laser elements that emit laser light according to an inputted current signal, a light receiving element that receives the laser light emitted from the semiconductor laser elements, and a controller that controls light emission of the semiconductor laser elements, wherein the controller includes:

a first semiconductor laser element drive circuit that outputs a current signal to the semiconductor laser elements according to an instruction signal, a second semiconductor laser element drive circuit that adjusts the current signal based on a light quantity of the laser light received by the light receiving element, and outputs the adjusted current signal to the semiconductor laser elements, and a circuit switching section that switches between the first semiconductor laser element drive circuit and the second semiconductor laser element drive circuit according to an instruction signal;

wherein the first semiconductor laser element drive circuit outputs a current signal to allow the semiconductor laser elements to emit pulsed laser light, and wherein the second semiconductor laser element drive circuit is used when a current signal is outputted to allow the semiconductor laser elements to emit continuous laser light;

a scan section that two-dimensionally scans laser light emitted from the light source apparatus, an objective lens that irradiates the laser light scanned by the scan section to a sample, and collects returning light returning from the sample, a light detector that detects the returning light being collected by the objective lens, and returning via the scan section, and a timing switching section that switches a detection timing of the light detector depending on a frequency of the pulsed laser light to be emitted when the circuit switching section switches a circuit to the first semiconductor laser element drive circuit.

10. The laser scanning microscope according to claim 9, wherein the light source apparatus further comprises:

a current detection section that detects a current signal value to be outputted to the laser diode elements when the second semiconductor laser element drive circuit is selected, a storage section that stores the current signal value detected by the current detection section and the light quantity of the laser light detected by the light receiving element while relating the signal value and the light quantity to each other, and an instruction signal correction section that corrects an instruction signal to be inputted into the first semiconductor laser element drive circuit based on the current signal value and the light quantity stored in the storage section when the first semiconductor laser element drive circuit is selected.

11. A laser scanning microscope comprising:

a light source apparatus including:

semiconductor laser elements that emit laser light according to an inputted current signal, a light receiving element that receives the laser light emitted from the semiconductor laser elements, and a controller that controls light emission of the semiconductor laser elements, wherein the controller includes:

a first semiconductor laser element drive circuit that outputs a current signal to the semiconductor laser elements according to an instruction signal, a second semiconductor laser element drive circuit that adjusts the current signal based on a light quantity of the laser light received by the light receiving element, and outputs the adjusted current signal to the semiconductor laser elements, and a circuit switching section that switches between the first semiconductor laser element drive circuit and the second semiconductor laser element drive circuit according to an instruction signal;

wherein the first semiconductor laser element drive circuit outputs a current signal to allow the semiconductor laser elements to emit pulsed laser light, and wherein the second semiconductor laser element drive circuit is used when a current signal is outputted to allow the semiconductor laser elements to emit continuous laser light;

a scan section that two-dimensionally scans laser light emitted from the light source apparatus, an objective lens that irradiates the laser light scanned by the scan section to a sample, and collects returning light returning from the sample, a plurality of light detectors having different detection timings, which detect the returning light being collected by the objective lens, and returning via the scan section, and a detector switching section that switches between the light detectors when the circuit switching section switches between the first semiconductor laser element drive circuit and the second semiconductor laser element drive circuit.

12. The laser scanning microscope according to claim 11, wherein the light source apparatus further comprises:
- a current detection section that detects a current signal value to be outputted to the laser diode elements when the second semiconductor laser element drive circuit is selected,
- a storage section that stores the current signal value detected by the current detection section and the light quantity of the laser light detected by the light receiving element while relating the signal value and the light quantity to each other, and
- an instruction signal correction section that corrects an instruction signal to be inputted into the first semiconductor laser element drive circuit based on the current signal value and the light quantity stored in the storage section when the first semiconductor laser element drive circuit is selected.

13. A laser scanning microscope comprising:
a light source apparatus including:
- semiconductor laser elements that emit laser light according to an inputted current signal,
- a light receiving element that receives the laser light emitted from the semiconductor laser elements, and
- a controller that controls light emission of the semiconductor laser elements,
- wherein the controller includes:
  - a first semiconductor laser element drive circuit that outputs a current signal to the semiconductor laser elements according to an instruction signal,
  - a second semiconductor laser element drive circuit that adjusts the current signal based on a light quantity of the laser light received by the light receiving element, and outputs the adjusted current signal to the semiconductor laser elements, and
  - a circuit switching section that switches between the first semiconductor laser element drive circuit and the second semiconductor laser element drive circuit according to an instruction signal;
  - wherein the first semiconductor laser element drive circuit outputs a current signal to allow the semiconductor laser elements to emit pulsed laser light, and
  - wherein the second semiconductor laser element drive circuit is used when a current signal is outputted to allow the semiconductor laser elements to emit continuous laser light;
- a scan section that two-dimensionally scans laser light emitted from the light source apparatus,
- an objective lens that irradiates the laser light scanned by the scan section to a sample, and collects returning light returning from the sample,
- a light detector that detects the returning light being collected by the objective lens, and returning via the scan section, and
- a timing switching section that switches at least one of a detection timing of the light detector and a detection circuit when the circuit switching section switches between the first semiconductor laser element drive circuit and the second semiconductor laser element drive circuit.

14. The laser scanning microscope according to claim 13, wherein the light source apparatus further comprises:
- a current detection section that detects a current signal value to be outputted to the laser diode elements when the second semiconductor laser element drive circuit is selected,
- a storage section that stores the current signal value detected by the current detection section and the light quantity of the laser light detected by the light receiving element while relating the signal value and the light quantity to each other, and
- an instruction signal correction section that corrects an instruction signal to be inputted into the first semiconductor laser element drive circuit based on the current signal value and the light quantity stored in the storage section when the first semiconductor laser element drive circuit is selected.

* * * * *